United States Patent [19]
McShane et al.

[11] Patent Number: 5,757,192
[45] Date of Patent: May 26, 1998

[54] METHOD AND APPARATUS FOR DETECTING A BAD CELL IN A STORAGE BATTERY

[75] Inventors: Stephen J. McShane, Oak Brook; Kevin I. Bertness, Batavia, both of Ill.

[73] Assignee: Midtronics, Inc., Burr Ridge, Ill.

[21] Appl. No.: 650,431

[22] Filed: May 20, 1996

[51] Int. Cl.$^6$ .................................................. G01N 27/416
[52] U.S. Cl. .................................... 324/427; 340/636
[58] Field of Search .............................. 320/48; 340/636; 364/483; 324/433, 434, 426, 427

[56] References Cited

U.S. PATENT DOCUMENTS

| | | |
|---|---|---|
| 3,873,911 | 3/1975 | Champlin . |
| 3,909,708 | 9/1975 | Champlin . |
| 4,322,685 | 3/1982 | Frailing et al. . |
| 4,816,768 | 3/1989 | Champlin . |
| 4,825,170 | 4/1989 | Champlin . |
| 4,881,038 | 11/1989 | Champlin . |
| 4,912,416 | 3/1990 | Champlin . |
| 5,140,269 | 8/1992 | Champlin . |
| 5,585,728 | 12/1996 | Champlin ................................ 324/430 |

Primary Examiner—Christine K. Oda
Attorney, Agent, or Firm—Westman, Champlin & Kelly, P.A.

[57] ABSTRACT

A method and apparatus for detecting a bad cell in a storage battery having a plurality of cells as provided. Input circuitry electrically couples to first and second terminals of the storage battery. Voltage measuring circuitry coupled to the input circuitry provides a voltage output related to a voltage potential between the first and second terminals of the storage battery. Conductance measuring circuitry coupled to the input circuitry provides a conductance output related to conductance of the storage battery. Voltage and conductance comparison circuitry compares the measured voltage and conductance to references and provide outputs. Output circuitry provides a bad cell output based upon the results of the comparisons.

12 Claims, 2 Drawing Sheets

METHOD AND APPARATUS FOR DETECTING A BAD CELL IN A STORAGE BATTERY

BACKGROUND OF THE INVENTION

The present invention relates to testing of storage batteries. More specifically, the present invention relates to identifying a bad or defective cell in a storage battery.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin for testing storage batteries by measuring the conductance of the batteries. This technique is described in a number of United States patents obtained by Dr. Champlin, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; and U.S. Pat. No. 5,140,269, issued Aug. 18, 1992, to Champlin, entitled ELECTRONIC TESTER FOR ASSESSING BATTERY/CELL CAPACITY.

The prior art has largely failed to provide a useful and convenient technique for locating a bad cell in a battery. One technique for determining the presence of a bad cell among the plurality of cells in the storage battery is to measure the specific gravity of the acid in each cell. This is a time consuming technique in which acid must be removed from each of the individual cells. Furthermore, many new batteries are "maintenance free" batteries in which the battery is sealed and access to individual cells is prevented. In such batteries, it is impossible to test the specific gravity of the individual cells.

Another technique for identifying a bad cell is described in U.S. Pat. No. 4,322,685 which was issued on Mar. 30, 1982 to Frailing et al., entitled AUTOMATIC BATTERY ANALYZER INCLUDING APPARATUS FOR DETERMINING PRESENCE OF A SINGLE BAD CELL. The Frailing patent identifies bad cells in a storage battery using a load test technique. As described in column 2, lines 58–64, of the reference batteries having a voltage of less than 10.80 volts are always rejected as unacceptable.

The prior art lacks a simple and convenient technique for identifying a bad cell in a storage battery. More specifically, the art lacks a technique for quickly and accurately identifying a bad cell without requiring the battery be charged.

SUMMARY OF THE INVENTION

The present invention provides a method and apparatus for accurately identifying a bad cell in a storage battery having a plurality of cells. The apparatus includes input circuitry for electrically coupling to first and second terminals of the storage battery. Voltage measuring circuitry couples to the input circuitry and provides a voltage output related to a voltage potential measured between the first and second terminals of the storage battery. Conductance measuring circuitry coupled to the input circuitry provides a conductance output which is related to the conductance of the storage battery as measured between the first and second terminals of the storage battery. Voltage comparison circuitry compares the voltage output to a voltage reference and provides a discharged output if the voltage output is less than the voltage reference. Conductance comparison circuitry compares the conductance output to a conductance reference and provides a high conductance output if the conductance output is greater than the conductance reference. Output circuitry provides a bad cell output and response to the detection of the discharged output and a high conductance output. The bad cell output is indicative of a bad cell detected among the plurality of cells in the storage battery.

In a method for detecting a bad cell in a storage battery having a plurality of cells, the voltage of the storage battery is measured between the two terminals of the storage battery. The conductance of the storage battery is measured. The voltage of the storage battery is compared with a reference voltage and the conductance of the storage battery is compared with a reference conductance. A bad cell is detected if the voltage of the storage battery is less than the reference voltage and if the conductance of the battery is greater than the reference conductance.

DETAILED DESCRIPTION OF THE PREFERRED EMBODIMENTS

The present invention provides a new and useful technique for detecting a bad cell among of a plurality of cells in a storage battery, such as a lead acid storage battery. The present invention makes use of the aforementioned techniques of Dr. Keith S. Champlin to measure the electrical conductance of the storage battery in determining if a bad cell exists, in accordance with the present invention. By making use of the techniques provided by Dr. Champlin, the present invention provides a quick and convenient method and apparatus for detecting a bad cell which does not require the battery to be charged in order to make an accurate determination.

Figure 1:
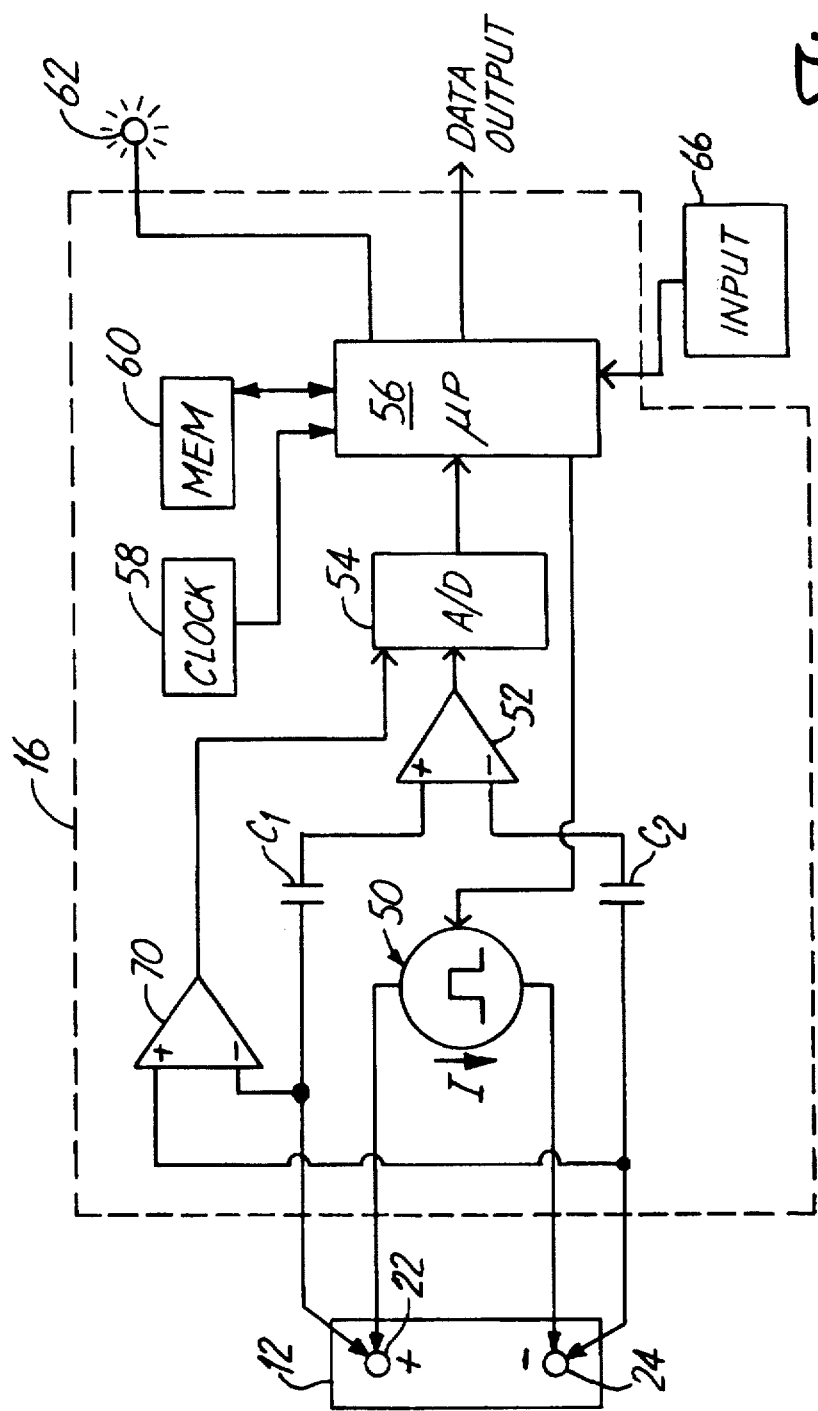
FIG. 1 is a simplified schematic diagram showing bad cell detection circuitry in accordance with the present invention.

FIG. 1 is a simplified block diagram of bad cell detection circuitry 16 in accordance with the present invention. Apparatus 16 is shown coupled to battery 12 which includes a positive battery terminal 22 and a negative battery terminal 24. Battery 12 is a storage battery having a plurality of individual cells, typically six, and a voltage of 12.6 volts.

Circuitry 16 operates in accordance with one embodiment of the present invention and determines the conductance ($G_{BAT}$) of battery 12 and the voltage potential ($V_{BAT}$) between terminals 22 and 24 of battery 12. Circuitry 16 includes current source 50, differential amplifier 52, analog-to-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, bad cell indicator 62 and analog-to-digital converter 54. Microprocessor 56 is also capable of receiving an input from input device 66.

In operation, current source 50 is controlled by microprocessor 56 and provides a current in the direction shown by the arrow in FIG. 1. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the conductance of battery 12 using the following equation:

$$\text{Conductance} = G_{BAT} = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$.

Figure 2:
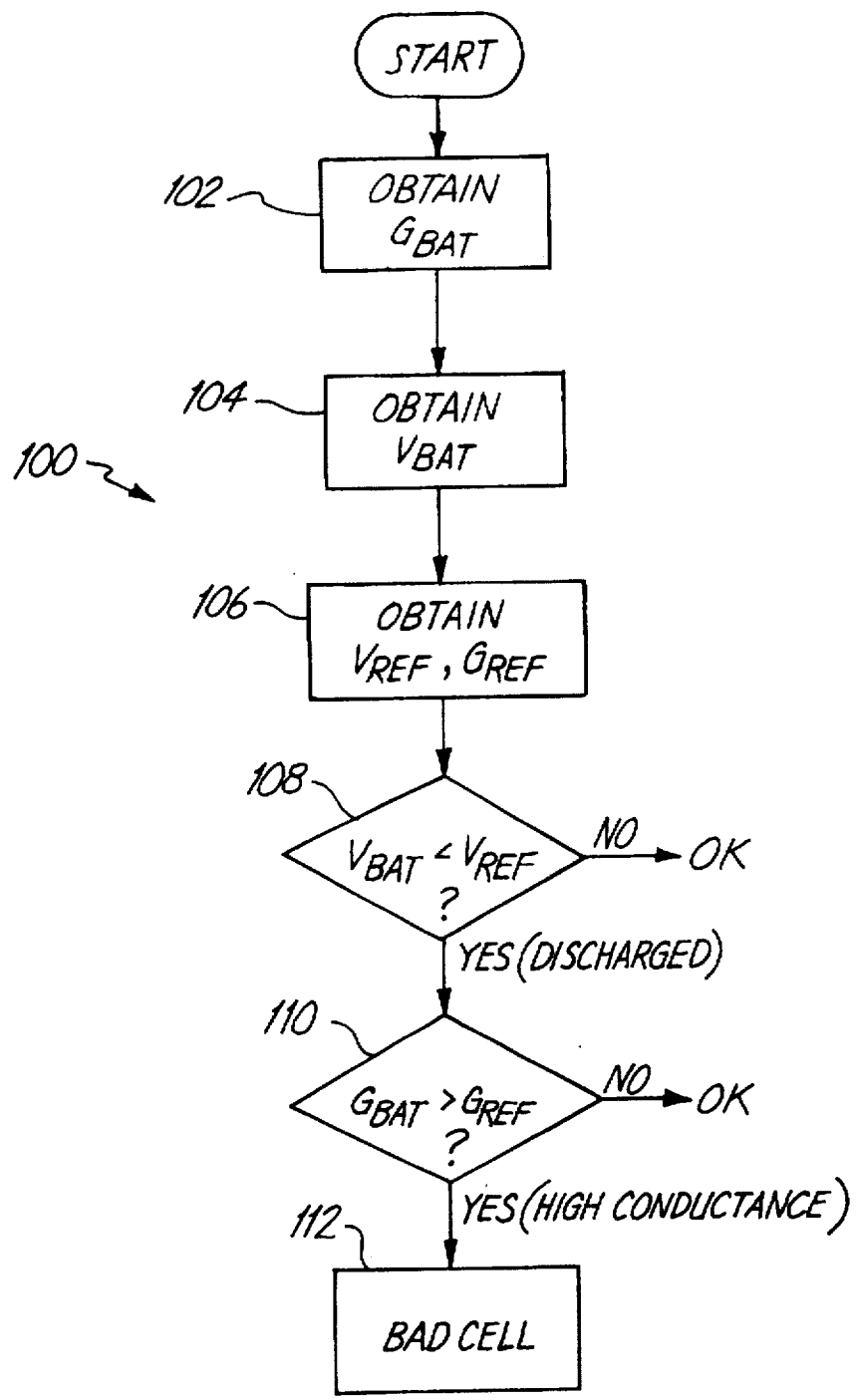
FIG. 2 is a flow chart showing steps performed by a microprocessor and FIG. 1 operating in accordance with the present invention.

Microprocessor 56 operates in accordance with the present invention and determines the presence of a bad cell in battery 12. FIG. 2 is a flow chart 100 showing operation of microprocessor 56 based upon programming instructions stored in memory 60. At block 102, microprocessor 56 calculates battery conductance $G_{BAT}$ in accordance with equation 1. At block 104, microprocessor 56 determines the open circuit voltage $V_{BAT}$ across terminals 22 and 24 using, for example, analog-to-digital converter 54 and amplifier 70. Note that in measuring the voltage $V_{BAT}$, capacitors $C_1$ and $C_2$ should be removed from the circuit such that the DC voltage of the battery may be measured.

Next, at block 106, microprocessor 56 obtains a reference voltage $V_{REF}$ and a reference conductance $G_{REF}$ stored in memory 60. At block 108, if $V_{BAT}$ is less than $V_{REF}$, a discharge condition is detected and control is passed to block 110. If, on the other hand, $V_{BAT}$ is not less than $V_{REF}$, then the battery is determined to be in a charge condition and may be tested in accordance with known battery testing techniques, such as those described by Dr. Champlin.

At block 110, if $G_{BAT}$ is less than $G_{REF}$, the discharged condition is determined to be not due to a bad cell. If, on the other hand, $G_{BAT}$ is greater than $G_{REF}$, a bad cell output is provided at block 112. For example, warning light 62 can be illuminated to indicate that a bad cell condition exists or data can be provided on a data output line from microprocessor 56 for storage or display in some other fashion.

In one preferred embodiment, the voltage reference $V_{REF}$ is about 11.0 volts and the conductance reference $G_{REF}$ is about 30 Mhos.

In one embodiment, values for $V_{REF}$ and $G_{REF}$ are stored in memory 60 for various types of storage batteries. An operator selects the particular storage battery being tested using input device 66 whereby microprocessor 56 retrieves the appropriate reference values from memory 60.

Table 1 is a table which shows a number of tests performed in accordance with the present invention. Table 1 shows the open circuit voltage $V_{BAT}$ of a battery and the battery conductance $G_{BAT}$. The bad cell in a battery is determined by measuring the specific gravity of each cell in the battery and number of that cell (1–6) is indicated. The result of a test performed in accordance with the present invention is also shown.

| Voltage ($V_{BAT}$) | Conductance (Mhos) ($G_{BAT}$) | Bad cell Number | Test Result |
|---|---|---|---|
| 10.6 | 61 | 3 | Bad cell |
| 10.6 | 84 | 2 | Bad cell |
| 10.5 | 54 | 1 | Bad cell |
| 10.2 | 44 | 1 | Bad cell |
| 10.1 | 33 | 5 | Bad cell |
| 9.9 | 38 | 3 | Bad cell |
| 9.9 | 0 | None | No bad cell |
| 9.8 | 0 | None | No bad cell |
| 9.8 | 38 | 5 | Bad cell |
| 9.7 | 0 | None | No bad cell |
| 9.7 | 29 | 3 | Bad cell |
| 8.8 | 40 | 4 | Bad cell |
| 8.1 | 63 | 2 and 3 | Bad cell |
| 7.7 | 40 | 3 and 5 | Bad cell |

-continued

| Voltage ($V_{BAT}$) | Conductance (Mhos) ($G_{BAT}$) | Bad cell Number | Test Result |
|---|---|---|---|
| 6.6 | 0 | None | No bad cell |
| 6.2 | 0 | None | No bad cell |
| 6.0 | 0 | None | No bad cell |

The present invention may be implemented using any appropriate technique. For simplicity, a single technique has been illustrate herein. However, other techniques may be used including implementation in all analog circuitry. Additionally, by using appropriate techniques, the battery resistance and a reference resistance (the reciprocal of conductance) may be employed in the invention. It should be noted that the various reference values may be stored in memory or may be generated using appropriate circuits and the various comparisons described in the flow chart of FIG. 2 may be implemented using analog comparison circuitry.

The present invention provides a quick and convenient technique for determining if a battery has a bad cell. The invention does not require that the battery be recharged before testing. This saves time which is of particular importance in an automotive service environment. Furthermore, the present invention will indicate that the battery has a bad cell so that an operator knows that the battery does not need to be recharged which could lead to potential damage. The techniques described herein may be incorporated as one step of an overall battery test procedure.

Although the present invention has been described with reference to preferred embodiments, workers skilled in the art will recognize that changes may be made in form and detail without departing from the spirit and scope of the invention.

What is claimed is:

1. An apparatus for detecting a bad cell in a storage battery having a plurality of cells, comprising:

input circuitry for electrically coupling to first and second terminals of the storage battery;

voltage measuring circuitry coupled to the input circuitry providing voltage output related to a voltage potential between the first and second terminals of the storage battery;

conductance measuring circuitry coupled to the input circuitry providing a conductance output related to conductance of the storage battery measured between the first and second terminals voltage comparison circuitry comparing the voltage output to a voltage reference and providing a discharged output if the voltage output is less than the voltage reference;

conductance comparison circuitry comparing the conductance output to a conductance reference and providing a high conductance output if the conductance output is greater than the conductance reference; and output circuitry providing a bad cell output in response to detection of a discharged output and a high conductance output, the bad cell output indicative of a bad cell among the plurality of cells in the storage battery.

2. The apparatus of claim 1 including a memory containing the voltage reference and the conductance reference.

3. The apparatus of claim 2 including an input device for receiving an input from an operator used to select the voltage reference and conductance reference from a plurality of references stored in the memory.

4. The apparatus of claim 1 wherein the conductance measurement circuitry determines conductance by measuring resistance.

5. The apparatus of claim 1 wherein the voltage measuring circuitry, conductance measuring circuitry, voltage comparison circuitry, conductance comparison circuitry and the output circuitry are implemented using a microprocessor.

6. The apparatus of claim 1 including a known current source for injecting a known current into the storage battery and the conductance measuring circuitry measure conductance based upon the known current and a resultant change in voltage of the storage battery.

7. The apparatus of claim 1 wherein the conductance measuring circuitry uses a Kelvin connection to connect to the storage battery.

8. A method of detecting a bad cell in a storage battery having a plurality of cells, comprising the steps of:

measuring a voltage ($V_{BAT}$) across terminals of the storage battery;

measuring a conductance ($G_{BAT}$) of the storage battery;

comparing the voltage ($V_{BAT}$) to a reference voltage ($V_{REF}$);

comparing the conductance ($G_{BAT}$) to a reference conductance ($G_{REF}$); and indicating a bad cell exists in the battery based upon the comparisons.

9. The method of claim 8 including:

detecting a discharged condition if the voltage $V_{BAT}$ is less than the reference voltage ($V_{REF}$);

detecting a high conductance condition if the conductance ($G_{BAT}$) is greater than the reference conductance ($G_{REF}$); and indicating the bad cells exists in response to the discharged condition and the high conductance condition.

10. The method of claim 8 wherein determining the conductance comprises injecting a current and measuring change in voltage.

11. The method of claim 8 including retrieving the reference voltage $V_{REF}$ and the reference conductance $G_{REF}$ from a memory.

12. The method of claim 8 wherein the reference voltage $V_{REF}$ and the reference conductance $G_{REF}$ are selected based upon the type of the storage battery.

* * * * *